United States Patent
Burnette et al.

(10) Patent No.: US 7,074,627 B2
(45) Date of Patent: Jul. 11, 2006

(54) LEAD SOLDER INDICATOR AND METHOD

(75) Inventors: Terry E. Burnette, New Braunfels, TX (US); Thomas H. Koschmieder, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/879,242

(22) Filed: Jun. 29, 2004

(65) Prior Publication Data

US 2005/0285274 A1 Dec. 29, 2005

(51) Int. Cl.
*H01L 21/66* (2006.01)

(52) U.S. Cl. ............... 438/14; 438/15; 438/16; 438/612; 438/613; 438/614; 257/772; 257/779

(58) Field of Classification Search ........... 438/14–16, 438/612–614; 257/772, 779
See application file for complete search history.

(56) References Cited

U.S. PATENT DOCUMENTS

| | | | |
|---|---|---|---|
| 5,039,618 A | 8/1991 | Stone | |
| 5,086,966 A | 2/1992 | Melton et al. | |
| 5,088,007 A | 2/1992 | Missele | |
| 5,120,678 A | 6/1992 | Moore et al. | |
| 5,229,070 A | 7/1993 | Melton et al. | |
| 5,278,075 A | 1/1994 | Stone | |
| 5,320,272 A | 6/1994 | Melton et al. | |
| 5,330,917 A | 7/1994 | Stone | |
| 5,389,160 A | 2/1995 | Melton et al. | |
| 5,519,535 A | 5/1996 | Mok | |
| 5,523,920 A | 6/1996 | Machuga et al. | |
| 6,187,114 B1* | 2/2001 | Ogashiwa et al. | 148/400 |
| 6,261,868 B1 | 7/2001 | Miller | |
| 6,462,413 B1 | 10/2002 | Polese | |

OTHER PUBLICATIONS

"Lead Check Swabs," from http://www.professionalequipment.com email signup, Jun. 14, 2004, pp. 1-2.
"Lead Check," Sargent-Welch Environment, from http://sargentwelch.com, Jun. 14, 2004, p. 1.
Tippy Wicker, New Technologies Product Feature LF Green Solder Paste, Qualitek, www.qualitek.com/technology.html.

* cited by examiner

*Primary Examiner*—Lynne A. Gurley
(74) *Attorney, Agent, or Firm*—Kim-Marie Vo

(57) ABSTRACT

A solder system includes a lead (Pb) indicator and a solder flux. A method for forming a semiconductor device includes providing a carrier, applying the solder system to the carrier, coupling the terminal to the carrier via the solder system, melting the solder system to attach the terminal to the carrier and form a completed semiconductor device, and determining if the completed semiconductor device has a different predetermined property from the solder system.

9 Claims, 2 Drawing Sheets

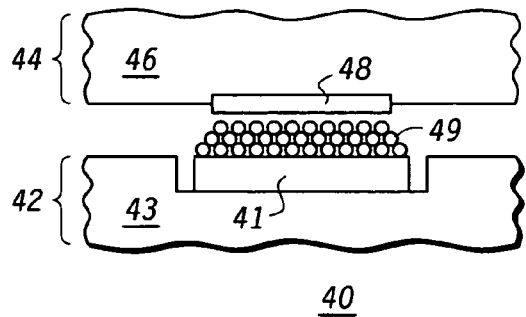
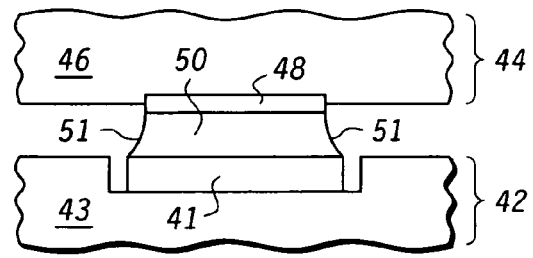
FIG. 7    FIG. 8
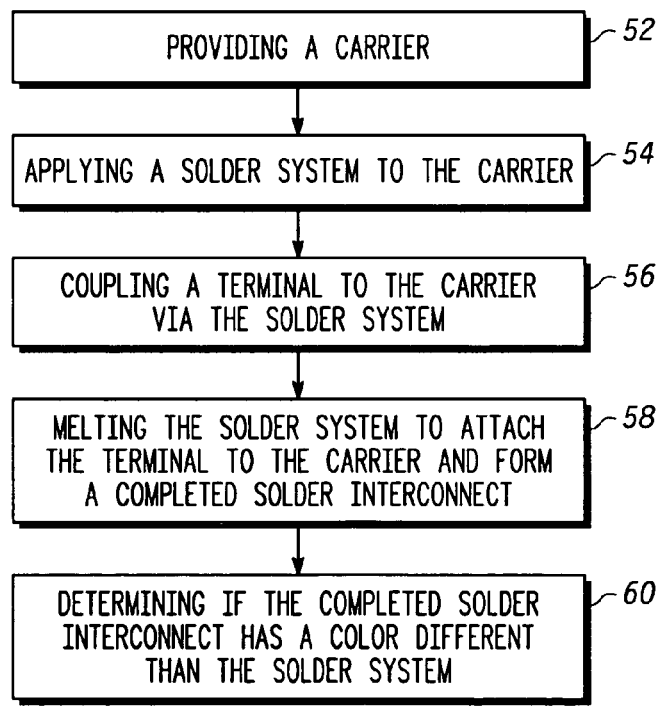
FIG. 9

LEAD SOLDER INDICATOR AND METHOD

FIELD OF THE INVENTION

This invention relates generally to semiconductor devices, and more specifically, to semiconductor devices using lead-free solder.

BACKGROUND

The Japanese and European Union governments have instituted policies requiring industries to remove environmentally hazardous materials from their products, thus creating "green" products. One material targeted, lead (Pb), is a major constituent of plastic ball grid array (PBGA) solder balls and the solder paste historically used to attach the component to the board. The lead-containing solder paste commonly used is eutectic tin-lead (63 wt % Sn/37 wt % Pb) and the ball is usually eutectic tin lead or also includes 2% Ag (62 wt % Sn/36 wt % Pb/2 wt % Ag). As a result of such legislation, the semiconductor industry is moving to lead-free solders. Lead-free solders being studied in the industry generally include elements such as tin (Sn), silver (Ag), copper (Cu), indium (In), antimony (Sb) and bismuth (Bi).

To comply with this legislation, companies need to be able to easily distinguish between lead-free and lead-containing materials. For example, assemblers may want to verify that the semiconductor device is lead-free before soldering it to their printed circuit board (PCB), especially if the composition of a terminal is unknown. In addition, there is a risk of mixing lead-free (Pb-free) and lead-containing (Pb-containing) balls when attaching them to ball grid array (BGA) substrates so testing of the material composition may be desired to avoid this risk. One method of testing to determine if lead is present includes performing analytical testing, but this increases costs, time, and complexity of manufacturing.

Another lead-testing (Pb-testing) method, used most often in homes to test paint and china dishes, includes using test swabs, such as those available in a lead-test kit sold by LeadCheck®. But test swabs require manually testing of each material. This results in increased cost and increased cycle time. Thus, a need exists for a way to detect if a material is lead-free or not without increasing cycle time and increasing cost.

BRIEF DESCRIPTION OF THE DRAWINGS

The present invention is illustrated by way of example and is not limited by the accompanying figures, in which like references indicate similar elements.

FIG. 7 illustrates a cross-section of a portion of a semiconductor device devoid of leads coupled to a printed circuit board (PCB) substrate by a solder system prior to a reflow process in accordance with an embodiment of the present invention;

FIG. 8 illustrates the semiconductor device of FIG. 7 after reflow in accordance with an embodiment of the present invention; and FIG. 9 illustrates a process for forming a semiconductor device in accordance with an embodiment of the present invention.

Figure 1:
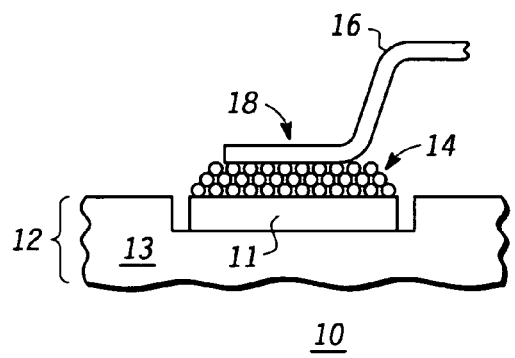
FIG. 1 illustrates a cross-section of a portion of a semiconductor device having a terminal coupled to a printed circuit board (PCB) substrate by a solder system prior to a reflow process in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

To determine if it is complying with regulations to decrease lead in semiconductor products, a company needs an easy method for detecting lead; manually checking each part is impractical. A chemical may be put in a terminal, a terminal coating, a carrier, a carrier coating, a solder system that couples a part to carrier, a coating of the solder system, or the like. The terminal may be a ball (or sphere), a lead (e.g., a J-lead), a no-lead, a pin, an end cap, pad, or the like. The terminal may be part of a package or be stand-alone. The terminal can be a J-lead on a quad flat package (QFP), a ball attached to a ball grid array (BGA) substrate, or a ball that has not yet been attached to the BGA substrate, or the like. The carrier may be a printed circuit board (PCB), a BGA substrate, any other type of substrate, or any supporting structure. The solder system may include a solder flux, a solder paste or the like.

A lead (Pb) indicator, which is one embodiment is an acid or a salt, may be added to the carrier, terminals, or solder system; or formed as a coating on the carrier, terminals or conductive material. When subjected to elevated temperature the lead (Pb) indicator reacts with lead (Pb), if present, and changes a property of the solder system. In one example, the lead (Pb) indicator forms a color, such as pink or black, that is different than the color of the material with the lead (Pb) indicator unreacted. In one embodiment, the reaction occurs during a reflow process, which is used to melt the solder system and form a solder interconnect.

The lead (Pb) indicator in a solder system can be applied to many structures. FIGS. 1–8 illustrate some of the different structures that would benefit from the use of the lead (Pb) indicator. FIG. 9 illustrates a method 50 for forming all the solder systems of FIGS. 2, 4 6 and 8.

In a first process 52 of the method 50, a carrier is provided. The carrier can be any carrier previously discussed, such as a BGA substrate or a PCB. A solder system is applied to the carrier during a second process 54. In one embodiment, the solder system includes the lead (Pb) indicator, a solder flux and a conductive material. The conductive material may be a solder powder including a eutectic composition of tin (Sn) and lead (Pb) and the solder flux may be a liquid that is rosin-based or detergent-based. In a third process 56, a terminal is coupled to the carrier via the solder system. Next, in a fourth process 58, the solder system is melted to attach the terminal to the carrier and form a completed solder interconnect. The melting, in one embodiment, occurs during a reflow process. In a fifth process 60, it is determined if the completed solder interconnect has a predetermined property, such as color, different from the solder system. If so, then lead is present.

FIG. 1 illustrates a cross-section of a semiconductor device 10 representative of a lead 16 on a QFP before a melting process. The semiconductor device 10 includes the lead 16 placed in a solder system 14, which is formed on a conductive pad 11. The conductive pad 11 is formed within a recess of a nonconductive material 13, which electrically isolates the conductive pad 11. The nonconductive material 13 and the conductive pad 11 form the carrier 12. In one embodiment, the carrier 12 is a PCB substrate, wherein the nonconductive material 13 is an organic material, such as solder mask, and the conductive pad includes copper or a copper alloy. The conductive pad 11, in one embodiment, is part of a conductive line of the carrier 12 and can be one layer or material, or multiple layers or materials. The carrier 12 may have an organic surface protectant (OSP) coating over the nonconductive material 13 and the conductive pad 11. In one embodiment, the OSP includes the lead (Pb) indicator.

The lead 16 may be any lead, such as an L-shaped lead (shown in FIG. 1). In one embodiment, the lead 16 has a foot 18, which is substantially parallel to the carrier 12. The foot is placed over the solder system 14 manually, by machine or the like. While only one lead is shown in FIG. 1, the lead 16 may be one of a plurality of leads on a package, which is true of each lead in all the figures.

The solder system 14 may be applied to the carrier 12 by any suitable process, such as screen printing. In one embodiment, the solder system 14 includes solder flux and solder powder. In another embodiment, the solder system 14 includes solder flux and the lead (Pb) indicator. In yet another embodiment, the solder system 14 also includes a solder paste, which may be a powder. In one embodiment, the solder paste includes lead (Pb), such as 63 wt % tin (Sn) and 37 wt % lead (Pb) paste. In another embodiment, the solder paste is lead-free (Pb-free), such as 95.5 wt % tin (Sn), 4 wt % silver (Ag) and 0.5 wt % copper (Cu) paste. The solder flux may be rosin-based (e.g., white pine rosin) or a detergent-based organic acid. Conventionally, solder flux is used to help reduce oxide levels and to temporarily bind solder powder before reflow. But the solder flux may also be a carrier for the lead (Pb) indicator. As illustrated, the solder system 14 is formed of many individual particles of a solder alloy.

The lead (Pb) indicator may be added to the solder system 14, put on or in the carrier 12, or put on or in the lead 16, especially the foot 18. In other words, the solder system 14, the carrier 12, or the lead 16 can be the carrier for the lead (Pb) indicator. The lead (Pb) indicator may be mixed into a composition, such as a liquid, that is already present in the process or is applied as an additional coating. The lead (Pb) indicator itself may be a liquid. If the lead (Pb) indicator is on the carrier, it may be in the OSP coating on the carrier 12. In this embodiment, the carrier 12 manufacturer or OSP manufacturer may mix the lead (Pb) indicator into the OSP coating prior to applying it to the carrier 12. If the lead (Pb) indicator is put on or in the lead 16 it could be a coating on the lead or be mixed into the conductive material used to make the lead, respectively. The lead (Pb) indicator can be mixed into the solder by the manufacturer of the solder system or by a subsequent purchaser of the solder system.

The lead (Pb) indicator can be any material that changes a property, such as color, when it reacts with lead (Pb) during any conditions that are present in a semiconductor packaging process. In one embodiment, the lead (Pb) indicator reacts with any lead (Pb) in the solder system when heat is applied; if any lead (Pb) is present, the lead (Pb) indicator changes a property of the solder, such as changing color or creating a new chemical. In a preferred embodiment, the lead (Pb) indicator is a visual lead indicator and can be detected by visual inspection. In one embodiment, the visual inspection is manual (e.g., by the human eye) and in another embodiment, the visual inspection is automatic (e.g., by a machine). In one embodiment, the automatic visual inspection uses white light or a laser. In one embodiment, a machine detects the presence of a chemical that exists when the lead (Pb) indicator reacts with lead. In one embodiment, the lead (Pb) indicator is a salt or acid. For example, the lead (Pb) indicator can be rhodizonic acid disodium salt, which turns a reddish pink when it reacts with lead, or sodium sulfide, which reacts with lead (Pb) to form lead (Pb) sulfide, a black precipitate.

In one embodiment, the lead (Pb) indicator reacts when heat is applied to the solder system. In one embodiment, the heat is applied when the solder system is transported or processed through a solder reflow furnace. If the solder system 14 is lead free (Pb-free) the minimum temperature may be approximately 217 degrees Celsius. If the solder system 14 includes lead (Pb), then the minimum temperature may be approximately 183 degrees Celsius.

Figure 2:
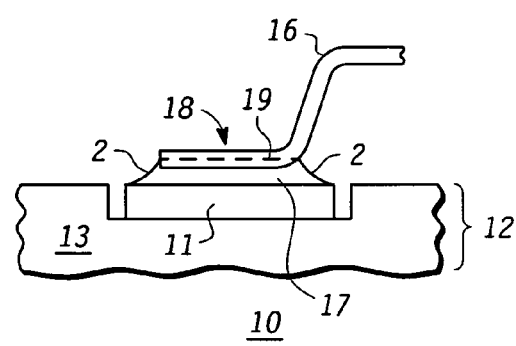
FIG. 2 illustrates the semiconductor device of FIG. 1 after reflow in accordance with an embodiment of the present invention.

FIG. 2 illustrates the semiconductor device 10 after reflow when a solder interconnect is formed. The solder interconnect includes solder, which couples the lead 16 to the carrier 12. Due to the physics involved with reflow, fillets 2 may be present at the ends of the solder 17. In addition, residue 19 may be present on the foot 18 of the lead 16. The residue 19 is a result of the solder reflow process and may have a consistency like wax. The residue 19 may include the lead (Pb) indicator. Without the lead (Pb) indicator present, the residue 19 is usually a light amber or a tone of white. If the lead (Pb) indicator is rhodizonic acid or sodium sulfide and lead is present the residue 19 will be pink or black, respectively, depending on which lead (Pb) indicator is used. The residue 19 is present above the solder 17 and may overlap with the solder 17. The top of the residue 19 is denoted with a dotted line for clarity.

The residue may be removed using a conventional cleaning process, such as terpene or water wash. It is believed that the presence of the lead (Pb) indicator in the residue 19 (or the solder 17) will not affect the ability to use conventional cleaning processes to remove the residue and any lead (Pb) indicator that is present in the residue. In other words, it is believed that the cleaning process will not become more difficult due to the presence of the lead (Pb) indicator.

Figure 3:
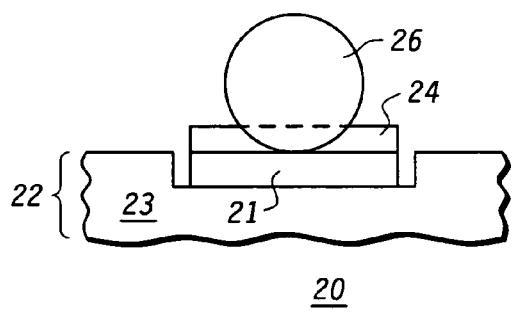
FIG. 3 illustrates a cross-section of a portion of a semiconductor device having a ball coupled to a ball grid array (BGA) substrate via a solder system prior to a first reflow process in accordance with an embodiment of the present invention.
Figure 4:
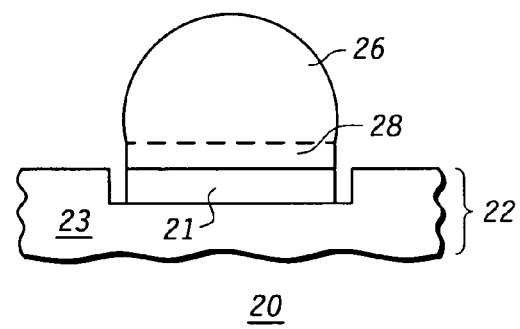
FIG. 4 illustrates the semiconductor device of FIG. 3 after the first reflow process in accordance with an embodiment of the present invention.

The lead (Pb) indicator can also be useful when attaching balls (also referred to as spheres) to a (BGA) substrate to form a semiconductor device 20, as shown in FIGS. 3 and 4. The semiconductor device 20 in FIG. 3 includes a ball 26, a carrier 22 and a solder system 24. The carrier 22 includes a conductive pad 21 and a nonconductive material 23. The carrier 22 may be a BGA substrate or a land grid array (LGA), which is a carrier with a square, rectangular, or other shaped pad. The conductive pad 21 may be any conductive material or layer of materials, such as copper. The solder system 24 can be any material described for the solder system 14 in FIGS. 1 and 2. In the embodiment shown in FIG. 3, the solder system 24 includes flux with no particles. (The solder system 24 is not shown having individual particles of a solder alloy.) But any suitable solder system can be used.

In one embodiment, a machine picks up and places the balls 26 from a platform or grid onto the carrier 22. It would be desirable to know if the ball 26 being placed on the carrier 22 includes lead (Pb). For example, if it is selling a lead free (Pb-free) part, a company may not want to throw away a BGA package because only one or a few of the balls 26 include lead (Pb). Generally, the closer a product is to completion the less desirable it is to scrap the product since the amount of money spent producing the product increases at each step in the process. In one embodiment, the balls 26 include sodium sulfide and undergo processing, such as a high temperature process (e.g., greater than 179 degrees Celsius), so that the sodium sulfide reacts with any lead present. By using a white light or a laser, the balls 26 that include lead will appear black so the pick-and-place machine will not recognize that the balls are present. In other words, the location of the balls with lead (Pb) will look the same as a location without a ball present so the machine will skip the balls with lead (Pb).

Alternatively, the lead (Pb) indicator can be present in the solder system 24 on the carrier 22 and react with any lead (Pb) during reflow that occurs to attach the ball 26 to the carrier 22. As shown in FIG. 4, after reflow the solder system 24 forms a solder interconnect. The same processing described for the reflow for FIGS. 1 and 2 may be used. During reflow, the solder system 24 merges with the ball 26 and may deform the ball 26. The ball 26 may become a hemisphere or a deformed sphere since it expands in diameter and seems to flatten at the interface between the ball 26 and the conductive pad 21 when it merges with the solder system 24. Regardless, as used in this specification, the ball 26 will refer to the ball 26 regardless of its deformed shape. In other word, the ball 26 at different stages in processing may have different shapes and may not even be a complete sphere. Similar to FIG. 2, a residue 28 may be present and may include the lead (Pb) indicator. The same cleaning processes discussed in regards to FIG. 2 can be used for the semiconductor device 20 of FIG. 4.

Figure 5:
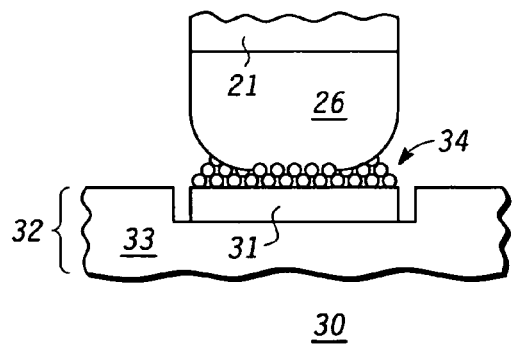
FIG. 5 illustrates the semiconductor device of FIG. 4 coupled to a PCB substrate prior to a second reflow process in accordance with an embodiment of the present invention.
Figure 6:
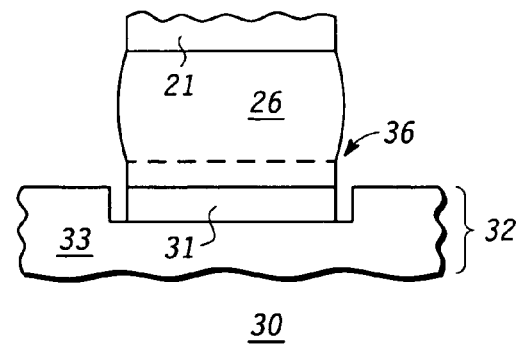
FIG. 6 illustrates the ball of FIG. 5 after the second reflow process in accordance with an embodiment of the present invention.

After the carrier 22 is populated with balls, like the ball 26, a package is formed which includes the semiconductor device 20. (Only a piece of the portion of the semiconductor device 20 is shown in FIGS. 5 and 6.) The package may then be attached to another carrier. A portion of the package and carrier is illustrated in FIG. 5 as a semiconductor device 30. The ball 26, which is coupled to the conductive pad 21 by solder (not shown) is placed (e.g., manually or by machine) on a solder system 34, which can be any solder system previously discussed. The solder system 34 overlies a conductive pad 31 in a recess of a nonconductive material 33. The conductive pad 31 and the nonconductive material 33 form a carrier 32. These portions of the semiconductor device 30 can be the same as the conductive pad, the nonconductive material 13 and the carrier 12 of FIGS. 1 and 2. In fact, FIGS. 5 and 6 are very similar to FIGS. 1 and 2 except that in the former, the terminal is a ball of a BGA package and in the latter, the terminal is a lead of a QFP.

The semiconductor device 30 may be reflowed using the reflow process previous discussed in regards to FIG. 2 so that the solder system 34 becomes a solder interconnect. During reflow, the solder system 34 merges with the ball 26 and may deform the ball 26. The ball 26 may become a deformed sphere or a barrel-shape since it was previously deformed when coupled to the carrier 22 and is deformed again when coupled to the carrier 32. Regardless of its shape, element 26 will still be referred to as a ball.

Like other reflow process previously discussed, a residue 36 may be present. The residue 36 may include the lead (Pb) indicator. If lead is present in the ball 26 or the solder system 34, the lead (Pb) indicator will change the solder's property (e.g., color). As discussed above, any conventional clean can be performed to remove the residue 36.

Similar to FIGS. 5 and 6, FIGS. 7 and 8 replace the ball 26 and the carrier 22 with a carrier 44, which is a leadless package or leadless carrier. In the semiconductor device 40, the carrier 44 may be a quad flat no lead (QFN) package, leadless LGA, or the like. The leadless carrier 44 includes a substrate 46 and a conductive pad 48. The conductive pad 48 may be any shape such as a square or rectangle, as shown in FIG. 7, or a circle. The conductive pad 48 may be any conductive material, such as a tin-lead (Sn—Pb) alloy, nickel-palladium, or the like. The conductive pad 48 is placed over the solder system 49, which can be any material previously discussed for any of the solder systems 14, 24 and 34. The solder system 49 is formed over a conductive pad 41, which is formed in a trench of a nonconductive material 43. The conductive pad 41 and the nonconductive material 43 are part of the carrier 42, which is similar to the carriers 12 and 22. Likewise, the conductive pad 41 is like the conductive pads 21 and 31 and the nonconductive material 43 is like the nonconductive materials 23 and 33.

After a reflow process, which can be any reflow process previously discussed, the solder system 49 becomes a solder interconnect. The semiconductor device 40 couples the carrier 44, which may be a leadless carrier, to the carrier 42, which may be a PCB, via the solder 50. Like the solder 17 of FIG. 2, the solder 50 may have fillets 51 at opposite ends due to the physics applicable during reflow. If the solder 50, the conductive pad 48 or the conductive pad 41 include the lead (Pb) indicator, after reflow the solder 50 will have the changed predetermined property (e.g., color) if the solder 50, the conductive pad 48 or the conductive pad 41 include lead (Pb). Although not shown, a residue may be present and may include the lead (Pb) indicator. The residue may be removed using any conventional cleaning process.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. The term "plurality", as used herein, is defined as two or more than two. The term another, as used herein, is defined as at least a second or more. The term "coupled", as used herein, is defined as connected, although not necessarily directly, and not necessarily mechanically.

What is claimed is:

1. A method for forming a semiconductor device, the method comprising:
    providing a carrier;
    applying a solder system to the carrier, wherein the solder system comprises:
        a lead (Pb) indicator; and
        a solder flux; and
    coupling a terminal to the carrier via the solder system;
    melting the solder system to attach the terminal to the carrier and form a completed semiconductor device;
    determining if the completed semiconductor device has a different predetermined property from the solder system.

2. The method of claim 1, wherein determining further comprises visually inspecting the completed semiconductor device.

3. The method of claim 1, wherein applying the solder system further comprises applying a solder system, wherein the solder system further comprises a conductive material.

4. The method of claim 1, wherein applying the solder system further comprises applying a solder system, wherein the solder flux serves as a carrier for the lead (Pb) indicator.

5. The method of claim 1, wherein applying the solder system further comprises applying a solder system, wherein the lead (Pb) indicator further comprises a visual lead (Pb) indicator.

6. The method of claim 1, wherein applying the solder system further comprises applying the solder system as a coating on the carrier.

7. The method of claim 1, wherein applying the solder system further comprises applying the solder system, wherein the lead (Pb) indicator comprises rhodizonic acid.

8. The method of claim 1, wherein applying the solder system further comprises applying the solder system, wherein the lead (Pb) indicator comprises sodium sulfide.

9. The method of claim 1, wherein determining further comprises determining if the completed semiconductor device has a color different from the solder system.

* * * * *